United States Patent
Zhao et al.

(10) Patent No.: US 10,790,295 B2
(45) Date of Patent: Sep. 29, 2020

(54) STAIRCASE FORMATION IN THREE-DIMENSIONAL MEMORY DEVICE

(71) Applicant: Yangtze Memory Technologies Co., Ltd., Wuhan, Hubei (CN)

(72) Inventors: Xiang Hui Zhao, Hubei (CN); Zui Xin Zeng, Hubei (CN); Jun Hu, Hubei (CN); Shi Zhang, Hubei (CN); Baoyou Chen, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 5 days.

(21) Appl. No.: 16/046,750

(22) Filed: Jul. 26, 2018

(65) Prior Publication Data

US 2019/0355738 A1 Nov. 21, 2019

Related U.S. Application Data

(63) Continuation of application No. PCT/CN2018/087519, filed on May 18, 2018.

(51) Int. Cl.
*H01L 27/11582* (2017.01)
*H01L 27/11556* (2017.01)
(Continued)

(52) U.S. Cl.
CPC .. *H01L 27/11573* (2013.01); *H01L 21/76816* (2013.01); *H01L 21/76877* (2013.01); *H01L 23/5226* (2013.01); *H01L 23/5283* (2013.01); *H01L 27/11521* (2013.01); *H01L 27/11529* (2013.01); *H01L 27/11556* (2013.01);
(Continued)

(58) Field of Classification Search
None
See application file for complete search history.

(56) References Cited

U.S. PATENT DOCUMENTS

| | | | |
|---|---|---|---|
| 2010/0052042 A1* | 3/2010 | Tanaka | H01L 27/11551 257/324 |
| 2011/0169071 A1 | 7/2011 | Uenaka et al. | |

(Continued)

FOREIGN PATENT DOCUMENTS

| | | |
|---|---|---|
| CN | 103545279 A | 1/2014 |
| CN | 107658224 A | 2/2018 |

OTHER PUBLICATIONS

International Search Report and Written Opinion of the International Searching Authority directed to related International PCT Application No. PCT/CN2018/087519, dated Jan. 29, 2019; 8 pages.

*Primary Examiner* — Grant S Withers
(74) *Attorney, Agent, or Firm* — Sterne, Kessler, Goldstein & Fox P.L.L.C.

(57) ABSTRACT

A method for forming a staircase structure of 3D memory, including: forming an alternating layer stack on a substrate, forming a plurality of staircase regions where each staircase region has a staircase structure having a first number (M) of steps in a first direction; forming a first mask stack to expose a plurality of the staircase regions; removing (M) of the layer stacks in the exposed staircase regions; forming a second mask stack over the alternating layer stack to expose at least an edge of each of the staircase regions in a second direction; and repetitively, sequentially, removing a portion of (2M) of layer stacks and trimming the second mask stack.

8 Claims, 15 Drawing Sheets

(51) Int. Cl.
   *H01L 27/11573* (2017.01)
   *H01L 21/768* (2006.01)
   *H01L 23/522* (2006.01)
   *H01L 23/528* (2006.01)
   *H01L 27/11521* (2017.01)
   *H01L 27/11529* (2017.01)
   *H01L 27/11568* (2017.01)
   *H01L 23/532* (2006.01)

(52) U.S. Cl.
   CPC .. *H01L 27/11568* (2013.01); *H01L 27/11582* (2013.01); *H01L 23/5329* (2013.01); *H01L 23/53209* (2013.01); *H01L 23/53214* (2013.01); *H01L 23/53242* (2013.01); *H01L 23/53257* (2013.01); *H01L 23/53271* (2013.01)

(56) References Cited

U.S. PATENT DOCUMENTS

| | | |
|---|---|---|
| 2011/0316069 A1 | 12/2011 | Tanaka et al. |
| 2012/0119287 A1 | 5/2012 | Park et al. |
| 2012/0306089 A1 | 12/2012 | Freeman et al. |
| 2014/0015057 A1 | 1/2014 | Lee et al. |
| 2017/0170193 A1 | 6/2017 | Lee et al. |
| 2019/0214404 A1* | 7/2019 | Ahn ................ H01L 29/40117 |
| 2019/0319042 A1* | 10/2019 | Baek ................ H01L 29/66666 |

* cited by examiner

STAIRCASE FORMATION IN THREE-DIMENSIONAL MEMORY DEVICE

CROSS-REFERENCE TO RELATED APPLICATIONS

This application claims priority to PCT Application No. PCT/CN2018/087519 filed on May 18, 2018, the entire content of which is incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array. A typical 3D memory architecture includes a stack of gate electrodes arranged over a substrate, with a plurality of semiconductor channels through and intersecting word lines into the substrate. The intersection of a word line and a semiconductor channel forms a memory cell.

The 3D memory architecture requires an electrical contact scheme to allow the control of each individual memory cells. One electrical contact scheme is to form a staircase structure to connect to word lines of each individual memory cells. Staircase structures have been used to connect more than 32 word lines along a semiconductor channel in a typical 3D memory device.

As semiconductor technology advances, 3D memory devices, such as 3D NAND memory devices, keep scaling more oxide/nitride (ON) layers. As a result, the existing multi-cycle trim and etch processes used to form such staircase structures suffer a low throughput and are expensive.

BRIEF SUMMARY

Embodiments of a method for forming a staircase structure of 3D memory devices are disclosed herein. The disclosed structures and methods provide numerous benefits including, but not limiting to, reduce fabrication complexity and manufacturing cost of 3D memory devices.

In some embodiments, a method for forming a 3D memory device includes forming an alternating layer stack comprising a plurality of dielectric layer pairs disposed over a substrate, and forming staircase regions where each of the staircase regions has a staircase structure with a first number (M) of steps in a first direction, where each of the M steps exposes a portion of a surface of a layer stack of the alternating layer stack and the first number M is a positive number. The method also includes removing M layer stacks of the alternating layer stack at a first plurality of the staircase regions. The method further includes removing 2M of a portion of layer stacks of the alternating layer stack at each of the staircase regions using a first mask stack, trimming the first mask stack; and repeating, sequentially, the removing 2M of a portion of layer stacks of the alternating layer stack at each of the staircase regions using the first mask stack and the trimming the first mask stack.

In some embodiments, the forming the staircase regions further includes forming a second mask stack over the alternating layer stack, patterning the second mask stack to define the staircase regions over the alternating layer stack using a lithography process, removing a portion of top-most dielectric layer pair using the second mask stack, trimming the second mask stack; and repeating, sequentially, the removing and the trimming until the M steps are formed.

In some embodiments, the removing M layer stacks of the alternating layer stack includes dry etching, wet etching, or a combination thereof In some embodiments, the trimming the first mask stack includes etching the first mask stack incrementally and inwardly using an isotropic dry etch, a wet etch, or a combination thereof.

In some embodiments, the first mask stack is patterned by a lithography process to expose at least an edge of each of the staircase regions in a first direction and covers each of the staircase regions extensively in a second direction.

In some embodiments, the first direction is perpendicular to the second direction, and both the first and second directions are parallel to a top surface of the substrate.

In some embodiments, the method further includes forming a plurality of vertical semiconductor channels in a stack storage region on the substrate, where each of the staircase regions is adjacent to the stack storage region.

In some embodiments, a lithography process is to define the first plurality of staircase regions and other staircase regions where the first plurality of staircase regions and the other staircase regions are separated by the stack storage region.

In some embodiments, a method for forming a 3D memory device includes forming an alternating layer stack over a substrate, removing a first number (M) of layer stacks of the alternating layer stack over a first portion of a surface of the alternating layer stack, where M is greater than one, and forming staircase structures over a second portion of the surface of the alternating layer stack, where the second portion of the surface includes the first portion of the surface and each of the staircase structures has M steps in a first direction, where each of the M steps is one level, exposing a portion of a surface of a layer stack of the alternating layer stack.

In some embodiments, the method further includes repeating, sequentially, a removing 2M number of layer stacks of the alternating layer stack at each of the staircase structures using a first mask stack and a trimming the first mask stack.

In some embodiments, the forming the alternating layer stack includes depositing the layers using chemical vapor deposition, physical vapor deposition, plasma-enhanced CVD, sputtering, metal-organic chemical vapor deposition, atomic layer deposition, or a combination thereof.

In some embodiments, the forming the alternating layer stack on the substrate includes disposing a plurality of dielectric layer pair on the substrate.

In some embodiments, a 3D memory device includes an alternating layer stack disposed over a substrate, a storage structure includes a plurality of vertical semiconductor channels, a first staircase regions adjacent to the storage structure, a second staircase regions adjacent to the storage structure, where the second staircase regions are horizontally separated from the first staircase regions by the storage structure, and a staircase structure disposed at each of the first and the second staircase regions to expose a portion of a plurality of layer stacks of the alternating layer stack, where the staircase structure includes a plurality of steps in a first direction and a first number (M) of steps in a second direction, where each of the steps in the first direction has 2M levels.

In some embodiments, the first direction is perpendicular to the second direction, and both the first and the second directions are parallel to a top surface of the substrate.

In some embodiments, each of steps in the second direction of the staircase structure is one level.

In some embodiments, a top-most layer stack of a staircase structure in the second staircase region is M levels lower than that in the first staircase region.

In some embodiments, each layer stack of the alternating layer stack includes an insulating material layer and a sacrificial material layer.

In some embodiments, each layer stack of the alternating layer stack includes the insulating material layer and a conductive material layer.

In some embodiments, the insulating material layer includes silicon oxide or aluminum oxide, the sacrificial material includes poly-crystalline silicon, silicon nitride, poly-crystalline germanium, poly-crystalline germanium-silicon, or a combination thereof.

In some embodiments, the conductive material layer includes poly-crystalline silicon, silicide, nickel, titanium, platinum, aluminum, titanium nitride, tantalum nitride, tungsten nitride, or a combination thereof.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
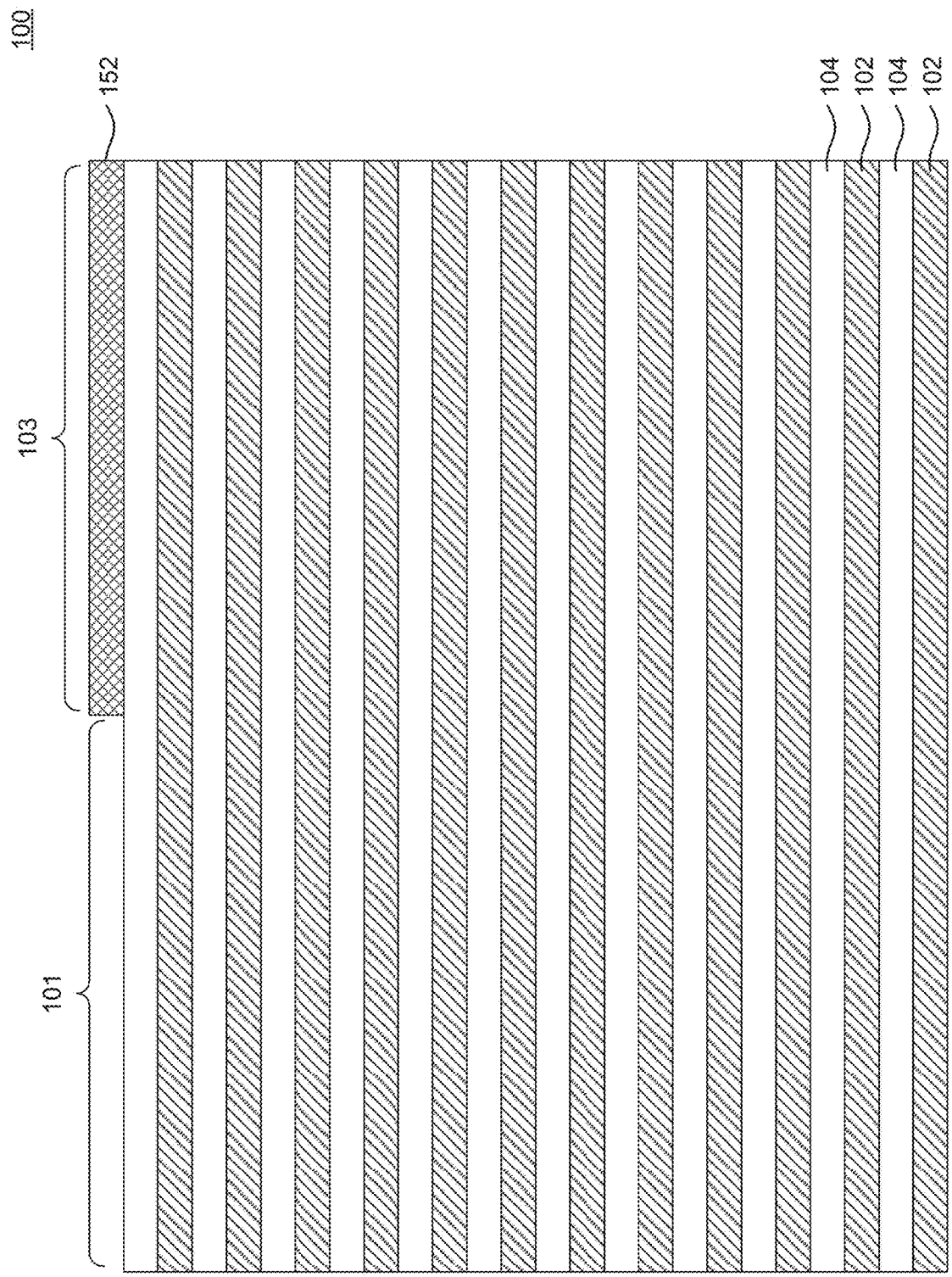
FIG. 1 illustrates a cross-sectional view of a plurality of dielectric layer pairs by a patterned photoresist stack, according to some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover. "above" or "over" not only means "above" or "over" something, but can also include the meaning it is "above" or "over" something with no intermediate feature or layer therebetween (i.e., directly on something).

Further, spatially relative terms, such as "beneath," "below." "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory device includes a semiconductor channel (e.g., a silicon channel) that extends vertically through a plurality conductor/dielectric layer pairs. The plurality of conductor/dielectric layer pairs are also referred to herein as an "alternating conductor/dielectric stack." The conductor layer of the alternating conductor/dielectric stack can be used as a word line (electrically connecting one or more control gates). An intersection of a word line and the semiconductor channel forms a memory cell. Vertically-oriented memory strings require an electrical connection between the conductive materials (e.g., word line plates or control gates) and access lines (e.g., word lines) so that each of the memory cells along the memory strings or in the 3D memory device can be uniquely selected for writing or reading functions.

In 3D memory device architectures, memory cells for storing data are vertically stacked to form a stacked storage structure. 3D memory devices can include a staircase structure formed on one or more sides of the stacked storage structure for purposes such as word line fan-out, where the stacked storage structure includes a plurality of semiconductor channels, where the semiconductor channels can be vertical or horizontal. As the demand for higher storage capacity continues to increase, the number of vertical levels of the stacked storage structure also increases. Accordingly, a thicker mask layer, such as photoresists (PR) layer, is needed to etch the staircase structure with increased levels. However, the increase of thickness of the mask layer can make the etch control of the staircase structure more challenging.

In the present disclosure, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. Each of the horizontal surfaces is referred as a "step" or "staircase" of the staircase structure. In the present disclosure, a horizontal direction can refer to a direction (e.g., the x-axis or the y-axis) parallel with a top surface of the substrate (e.g., the substrate that provides the fabrication platform for formation of structures over it), and a vertical direction can refer to a direction (e.g., the z-axis) perpendicular to the top surface of the structure.

A staircase structure can be formed from a dielectric stack layer by repetitively etching the dielectric stack layer using a mask layer formed over the dielectric stack layer. In some embodiments, the mask layer can include a photoresist (PR) layer. In the present disclosure, the dielectric stack layer includes a plurality of alternatively arranged dielectric layer pairs, and the thickness of each dielectric layer pair is one level. In other words, each of the dielectric layer pair is one level high vertically. In the present disclosure, term "stair" and term "step", used interchangeably, refer to one or more levels of a staircase structure and a step (or staircase) exposes a portion of a surface of a dielectric layer pair. In some embodiments, the dielectric layer pair includes alternating a first material layer and a second material layer. In some embodiments, the first material layer includes an insulating material layer. In some embodiments, the second material includes a sacrificial material layer or a conductive material layer. In some embodiments, the first material layer and the second material layer in one dielectric layer pair can have nominally the same height over the substrate so that one set can form one step. During the formation of the staircase structure, the mask layer is trimmed (e.g., etched incrementally and inwardly from the boundary of the dielectric stack layer) and used as the etch mask for etching the exposed portion of the dielectric stack. The amount of trimmed mask layer can be directly relevant (e.g., determinant) to the dimensions of the staircases. The trimming of the mask layer can be obtained using a suitable etch, e.g., an isotropic dry etch or a wet etch. One or more mask layers can be formed and trimmed consecutively for the formation of the staircase structure. Each dielectric layer pair can be etched, after the trimming of the mask layer, using suitable etchants to remove a portion of both the first material layer and the second material layer. After the formation of the staircase structure, the mask layer can be removed. In some embodiments, the second material layers are conductive material layers, and therefore can be gate electrodes (or word lines) of the 3D memory structure. In some embodiments, the second material layers of the staircase structure are sacrificial material layers and can then be replaced with metal/conductor layers (e.g., tungsten) to form the gate electrodes (or word lines) of the 3D memory structure.

The staircase structure can provide an interconnection scheme as word line fan-out to control the semiconductor channels after an interconnect formation process. Each of the dielectric layer pairs in the staircase structure intersect to a portion of a semiconductor channel. After replacing each of the sacrificial layers with metal/conductor layers, each of the conductive material layers in the staircase structure can control the portion of the semiconductor channel. An example of an interconnect formation process includes disposing or otherwise depositing, a second insulating material, such as silicon oxide, spin-on-dielectric, or borophosphosilicate glass (BPSG), over the staircase structure and planarizing the second insulating material. Each of the conductive material layers in the staircase structure is exposed to open a plurality of contact holes in the planarized second insulating material and the contact holes are filled with one or more conductive materials, such as titanium nitride and tungsten, to form a plurality of VIA (Vertical Interconnect Access) structures.

In the present disclosure, the term "SC" refers to a dielectric layer pair within a staircase structure. In some embodiments, the staircase structure includes an alternating layer stack, and each layer stack represents an SC layer.

FIG. 1 illustrates structure 100 having a plurality of SC layers formed over (e.g., on a top side of) a substrate (not shown). Each of the SC layers can include a dielectric layer pair with a first material layer 102 and a second material layer 104. A mask stack material (e.g. photoresist layer) is deposited and patterned to form mask stack 152 over the SC layers. Mask stack 152 defines a region 101 and a region 103 of the SC layers. A top surface of the SC layers at region 101 is exposed and the SC layers at region 103 are covered by mask stack 152. In some embodiments, mask stack 152 can include photoresist or carbon-based polymer material. In some embodiments, both regions 101 and 103 are defined by mask stack 152 using one or more processes including lithography and etching process.

First material layer 102 can be an insulating layer including silicon oxide and second material layer 104 can be a sacrificial layer including silicon nitride, and vice versa. In some embodiments, the sacrificial layer is replaced with a conductive material layer (e.g., a gate metal material) subsequently to form word lines of a 3D memory device. In some embodiment, the second material layer can be a conductive material layer.

In some embodiments, the substrate on which structure 100 is formed can include any suitable material for supporting the 3D memory structure. For example, the substrate can include silicon, silicon germanium, silicon carbide, silicon on insulator (SOI), germanium on insulator (GOI), glass, gallium nitride, gallium arsenide, any suitable III-V compounds, any other suitable material, and/or combinations thereof.

In some embodiments, a thickness of each SC layer can be the same as or different from each other. In some embodiments, the sacrificial layers include any suitable material different from the insulating material layers. For example, the sacrificial layer can include one or more of poly-crystalline silicon, silicon nitride, poly-crystalline germanium, poly-crystalline germanium-silicon, any other suitable materials, and/or combinations thereof. In some embodiments, the sacrificial layer can include silicon nitride. The insulating layer can include any suitable insulating materials, e.g., silicon oxide or aluminum oxide. The conductive material layer can include any suitable conductive material. In some embodiments, the conductive material layer can include one or more of poly-crystalline silicon, silicide, nickel, titanium, platinum, aluminum, titanium nitride, tantalum nitride, tungsten nitride, any other suitable material, and/or combinations thereof. The forming of the insulating material layer, the sacrificial material layer and the conductive material layer can include any suitable deposition methods such as, for example, chemical vapor deposition (CVD), physical vapor deposition (PVD), plasma-enhanced CVD (PECVD), sputtering, metal-organic chemical vapor deposition (MOCVD), atomic layer deposition (ALD), any other suitable deposition method, and/or combinations thereof. In some embodiments, the insulating layer, the sacrificial layer and the conductive material layer are each formed by CVD.

Figure 2:
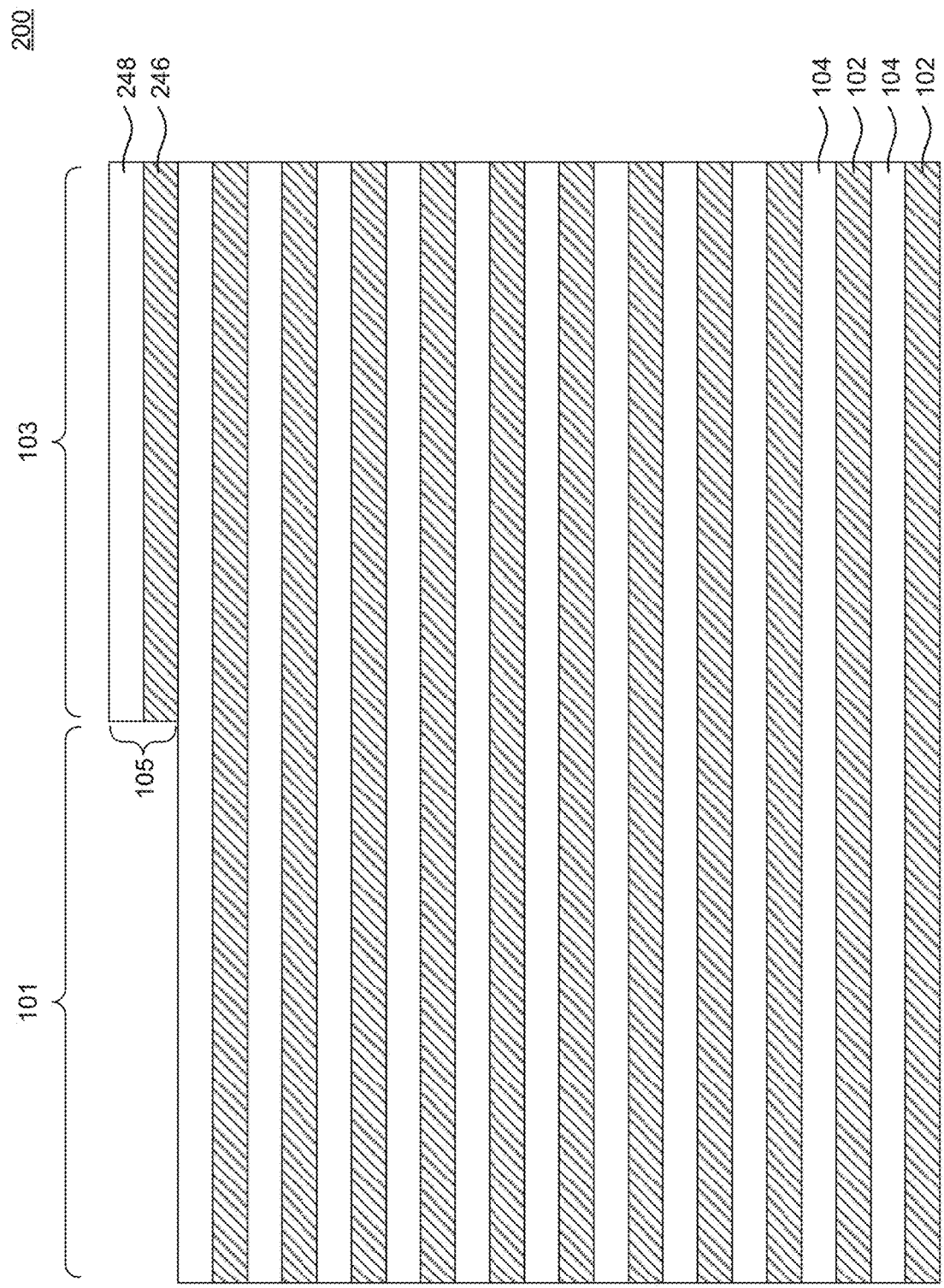
FIG. 2 illustrates a cross-sectional view of forming a first step with one level, according to some embodiments.

Referring to FIG. 2, staircase structure 200 is formed by creating step 105 (staircase with one level step) on structure 100 and removing mask stack 152. In some embodiments, mask stack 152 is removed after the formation of step 105. Step 105 has one level, including layers 246 and 248, and is formed by performing an etching process to remove at least a portion of a single SC layer from first region 101 defined by mask stack 152. In some embodiments, the etching process includes using any suitable etchants (e.g., wet etch and/or dry etch) to sequentially remove a portion of first material layer 102 and second material layer 104. In some embodiments, two different etchants are used to respectively remove a portion of first material layer 102 and a portion of second material layer 104. The etchant for first material layer 102 has a sufficient high etching selectivity over second layer material layer 104, and/or vice versa. Accordingly, the underlying SC layer can function as an etch-stop layer so that only the single SC layer is patterned/etched. In some embodiments, the first and the second material layers are etched using anisotropic etching such as reactive ion etch (RIE) or other dry etch. In some embodiments, the etchant includes carbon-fluorine ($CF_4$) based gases or hexafluoroethane ($C_2F_6$) based gases. In some embodiments, one etchant (e.g., of timed a wet etch process) is used to remove both the first material layer and the second material layer, and the etchant includes phosphoric acid. In various embodiments, the methods and etchants to remove a single SC layer should not be limited by the embodiments of the present disclosure.

Figure 3:
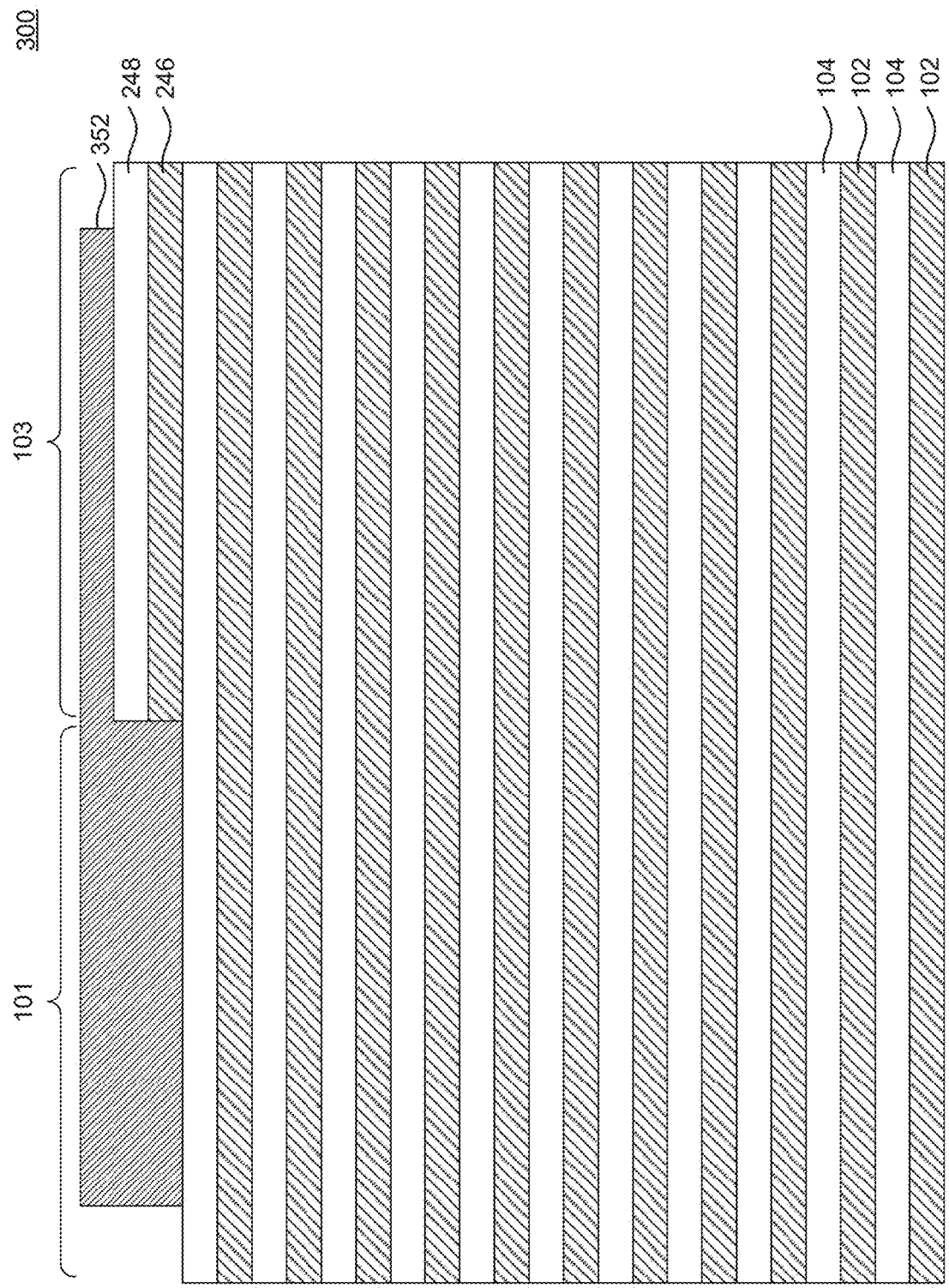
FIGS. 3-5 illustrate perspective representations of various stages of an etch-trim process that forms a step with two levels, according to some embodiments.

Referring to FIG. 3, staircase structure 300 is formed by patterning a mask stack 352 over a portion of the top surface of staircase structure 200. In some embodiment, mask stack 352 covers step 105. In some embodiments, mask stack 352 covers boundaries between region 101 and 103. In some embodiments, mask stack 352 can include photoresist or carbon-based polymer material. e.g. photoresist layer. In some embodiments, mask stack 352 can include any suitable material.

Figure 4:
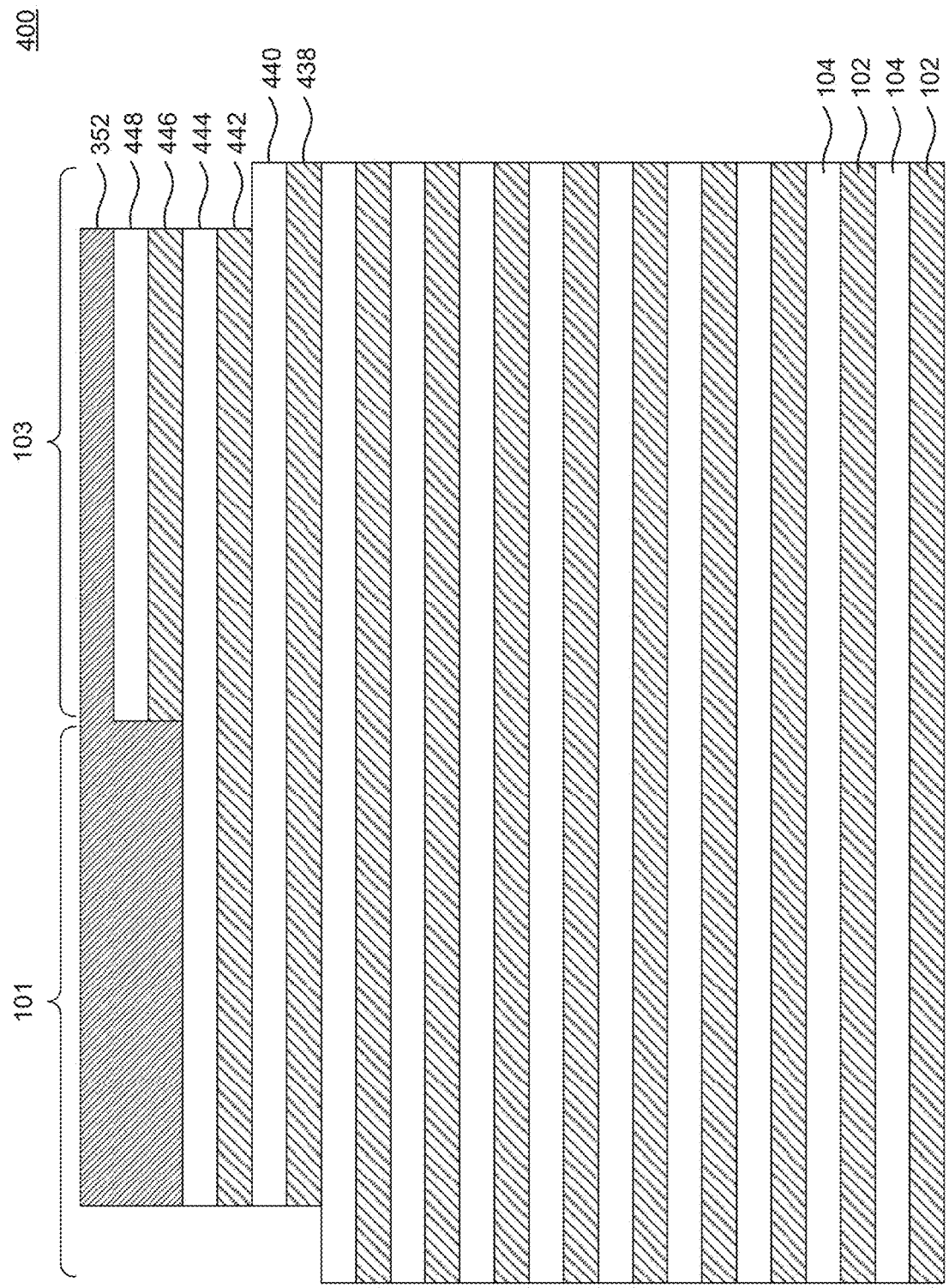
Figure 5:
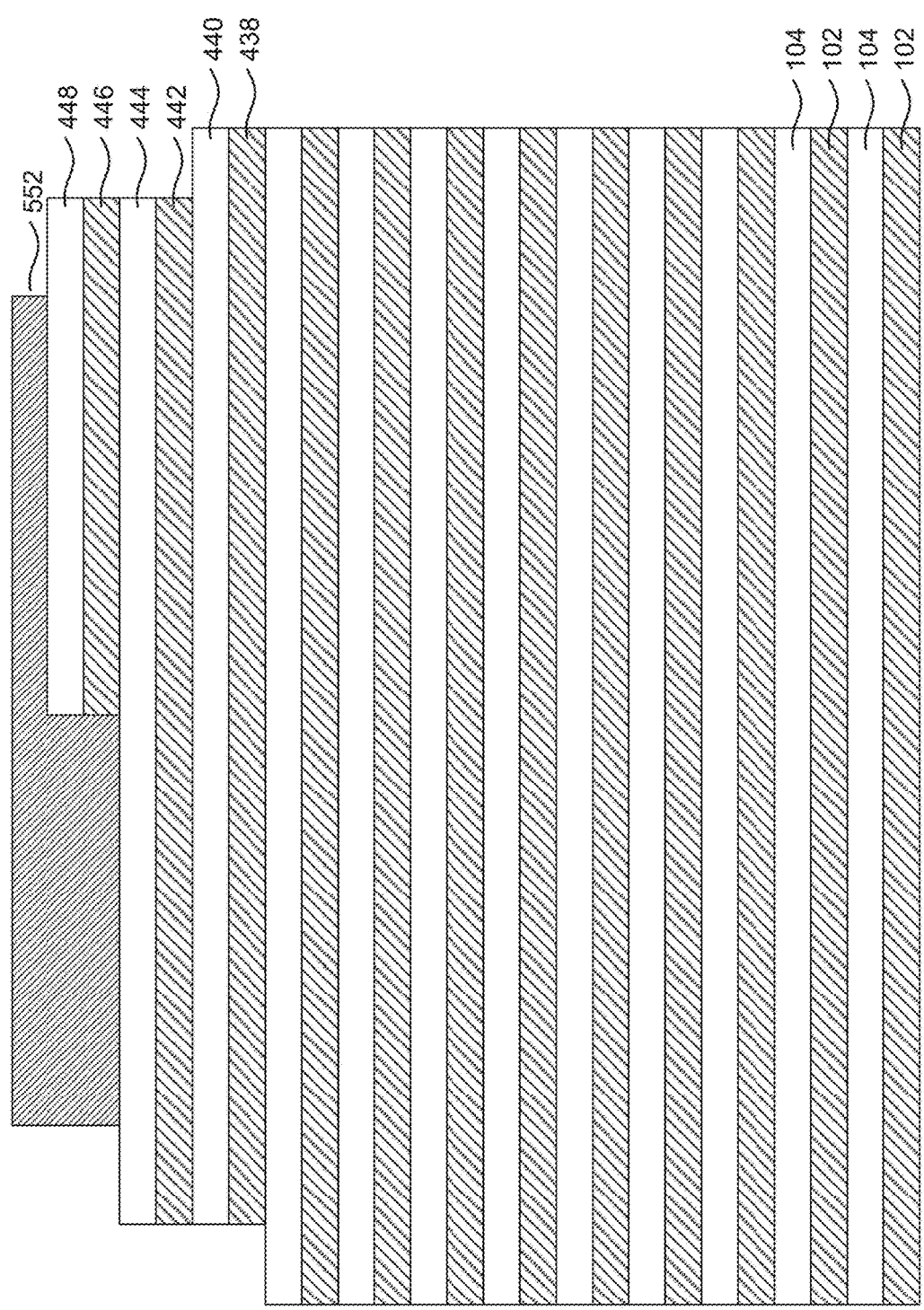

FIGS. 4-5 exhibit structures 400 and 500 with an etch-trim process, which includes an etching process (shown in FIG. 4) and a trimming process (shown in FIG. 5).

Referring to FIG. 4, a second step with two levels is created by the etching process to remove two consecutive SC layers from staircase structure 300. In some embodiments, the etching process can include repetitively performing the etching process twice. In some embodiments, a step with two levels is created. In some embodiments, two consecutive of the etching process can be performed to remove portions of two consecutive SC layers to form the step on layer 438, 440, 442 and 444 within first region 101, and/or on layer 442, 444, 446 and 448 within second region 103.

Referring to FIG. 5, mask stack 552 is formed after applying the trimming process on mask stack 352. The trimming process includes a suitable etch (e.g., an isotropic dry etch or a wet etch) and happens at directions parallel to a surface of the substrate. The amount of trimmed mask layer can be directly relevant to the lateral dimensions of the staircases. In some embodiments, mask stack 552 covers the first step created by the etching process (shown in FIG. 2).

Figure 6:
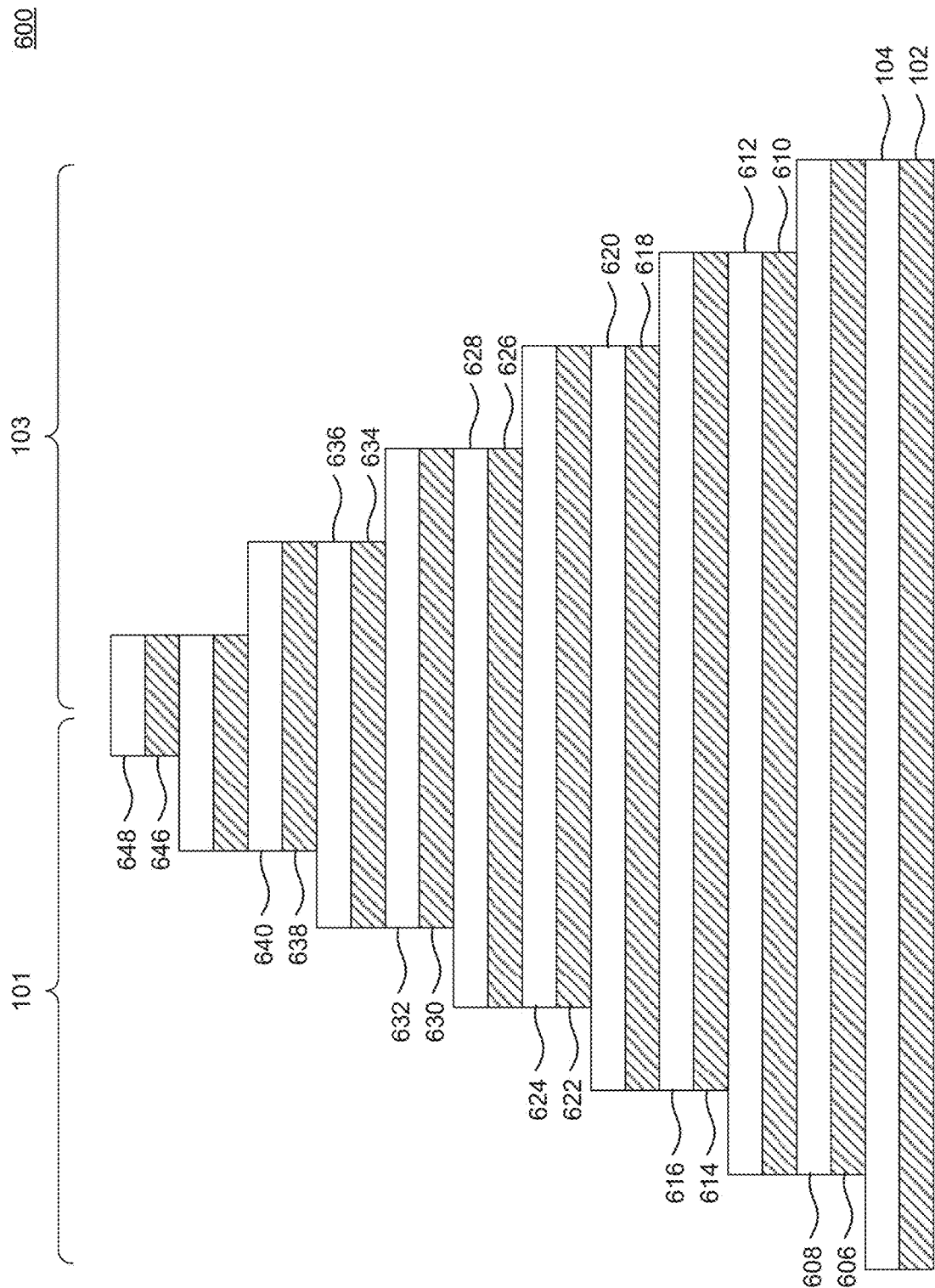
FIG. 6 illustrates a cross-sectional view of a staggered staircase structure, according to some embodiments.

Referring to FIG. 6, staggered staircase structure 600 is formed by repetitively performing the etch-trim process on staircase structure 300 followed by stripping mask stack 352. In some embodiments, the repetitive etch-trim processes expose a portion of top surfaces of the odd SC layers (e.g., layers 102/104, layers 610/612, layers 618/620, layers 626/628, layers 634/636 . . . , etc.) at second region 103 and a portion of top surfaces of the even SC layers (e.g., layers 606/608, layers 614/616, layers 622/624, layers 630/632, layers 638/640 . . . , etc.) at first region 101. In some embodiments, a top-most SC layer (e.g., layers 646/648) can be exposed at a top of staggered staircase structure 600. In some embodiments, the top-most SC layer (e.g., layers 646/648) is exposed at both the regions 101 and 103. In some embodiments, each of the SC layers can be exposed either at region 101 or 103.

Figure 7B:
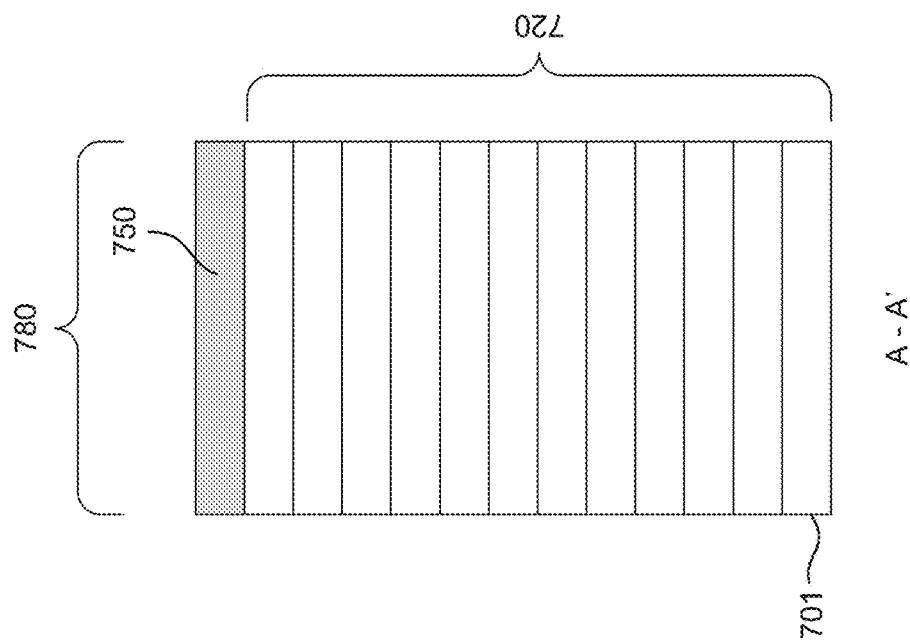
FIG. 7B illustrates a cross-sectional view of staircase regions, according to some embodiments.
Figure 7A:
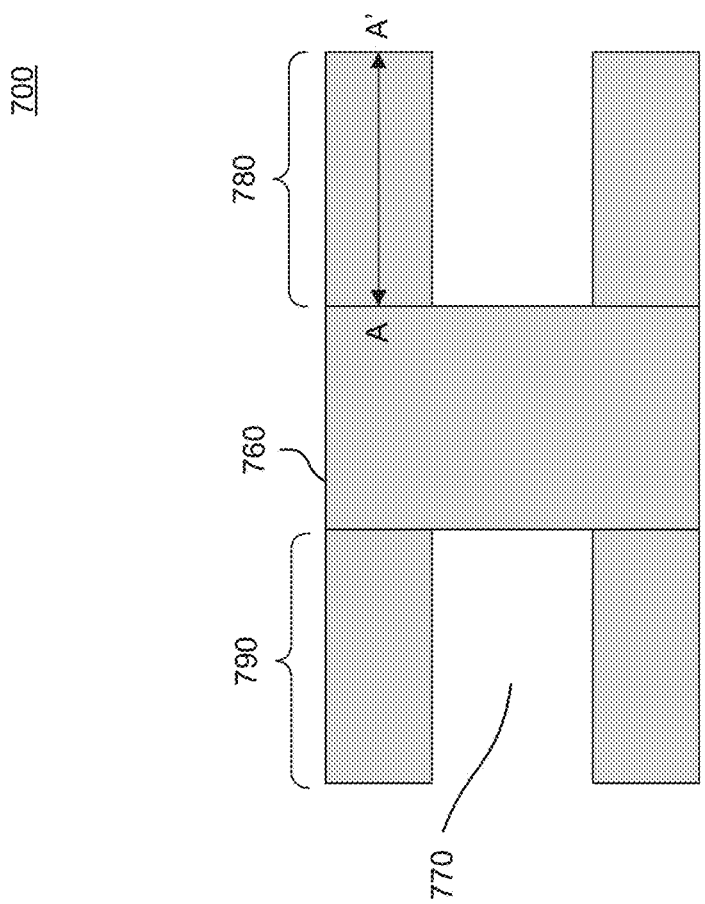
FIG. 7A illustrates a top view of an exemplary 3D memory structure, according to some embodiments.

FIGS. 7A-7B show a top view as well as the corresponding cross-sectional representations of a 3D memory device 700, in accordance with some embodiments of the disclosure.

Referring to FIG. 7A, 3D memory device 700 includes a stacked storage structure region 760 and a plurality of staircase regions 780 and 790 separated by slits 770. Although FIG. 7A shows one slit 770, 3D memory device 700 can include a plurality of slits. Stacked storage structure region 760 can include a plurality of semiconductor channels. In some embodiments, staircase regions 780 and 790 are distributed at different regions adjacent to stacked storage structure region 760. In some embodiments, each of staircase regions 780 is separated from each of staircase regions 790 by stack storage region 760 in a direction parallel to a surface of the substrate (e.g. x-direction). In some embodiments, after an interconnect formation process, staircase regions 780 and 790 provide a word line fan-out to uniquely select each of memory cells along a semiconductor channel in stacked storage structure region 760.

FIG. 7B exhibits a cross-sectional view of staircase region 780 along a line A-A' specified in FIG. 7A. A plurality of SC layers 720 are formed over a substrate (not shown) in staircase region 780. Each of the plurality SC layers 720 can be made of an alternative stack of the first material layer and the second material layer. For example, SC layer 701 is conceptually identical to combination of layer 102 and layer 104 shown in FIG. 1, and so on. Mask stack 750 is formed over the SC layers and covers a top surface of the SC layers 720 at staircase region 780. In some embodiments, mask stack 750 can include photoresist or carbon-based polymer material. In some embodiments, cross-sectional views of staircase regions 790 are identical to those of staircase regions 780.

Figure 8B:
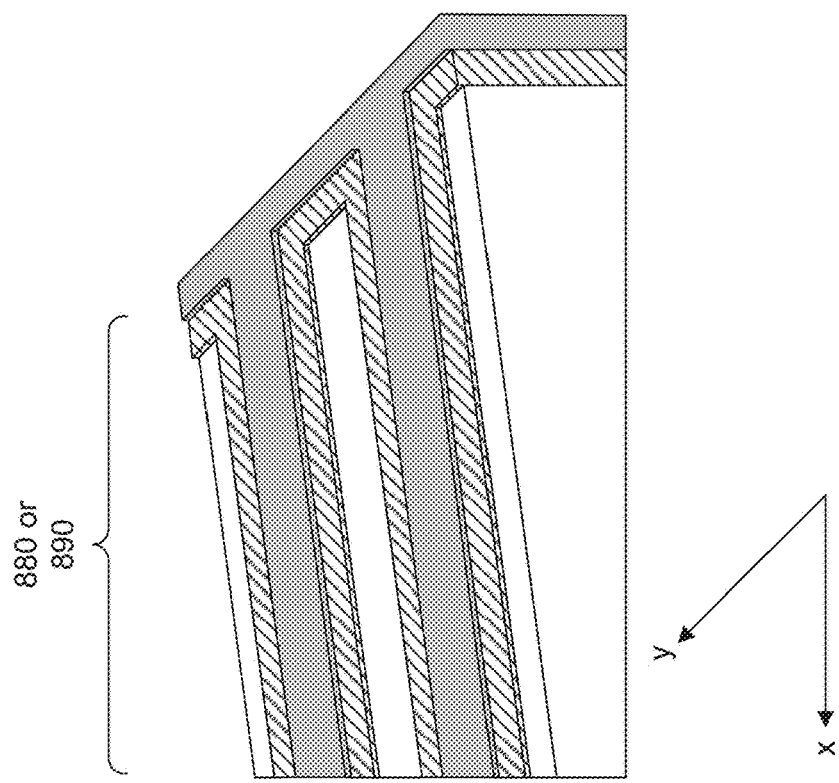
FIG. 8B illustrates a 3D-view of staircase regions, according to some embodiments.
Figure 8A:
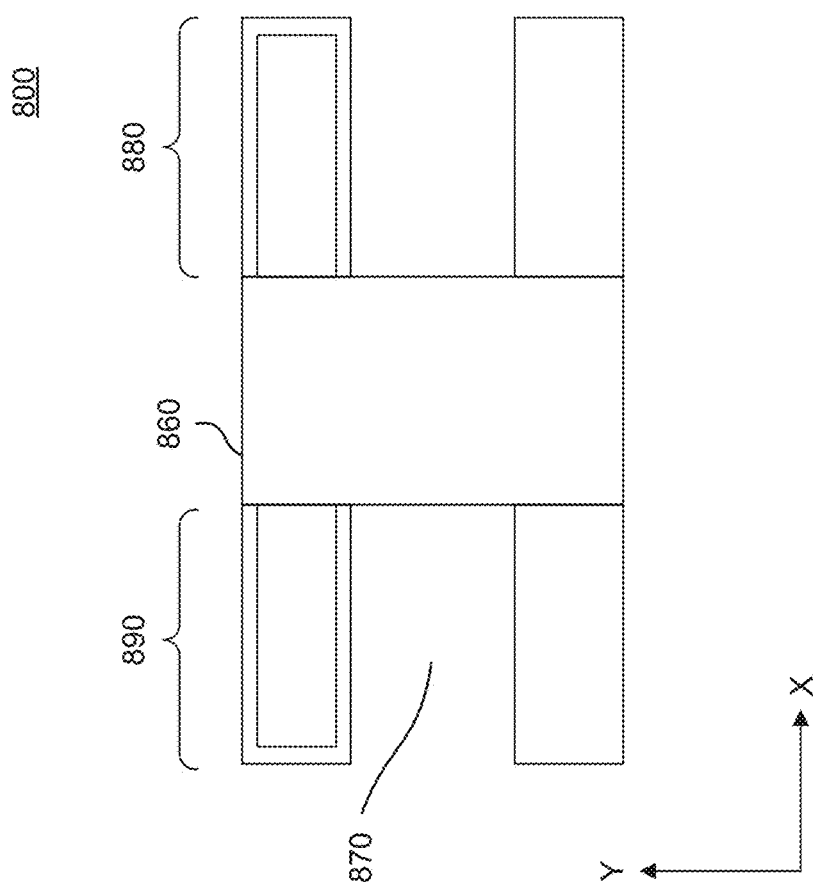
FIG. 8A illustrates a top view of an exemplary 3D memory structure after forming a staircase structure at each of the staircase regions, according to some embodiments.

FIG. 8A shows some embodiments of a top view of 3D memory device 800 after forming a first staircase structure at each of staircase regions 880 and 890. The first staircase structure is formed by applying a repetitive etch-trim process at staircase regions 780 of 3D memory device 700. In some embodiments, the first staircase structure has three steps at each of staircase regions 880 and 890, and each of the three steps is one level. As the result, the first staircase exposes a portion of three top-most SC layers. In some embodiments, the first staircase structure has a first number (M) of steps at each of staircase regions 880 and 890, and each of the M steps is one level, where the first number M is larger than two (M>2). In some embodiments, the first staircase structure does not form at stack storage region 860.

FIG. 8B represents a 3D view of FIG. 8A, where the first staircase structure has three steps (M=3) at each of the staircase regions 880 and 890. As shown in FIG. 8B, the first staircase structure exhibits three steps (M=3), and each of the three steps is one level. In some embodiments, more than two steps are formed (M>2) in the first staircase along a horizontal direction parallel to a surface of the substrate (e.g., in the y-direction or x-direction), where the first staircase exposes a portion of M of top-most SC layers.

Figure 9B:
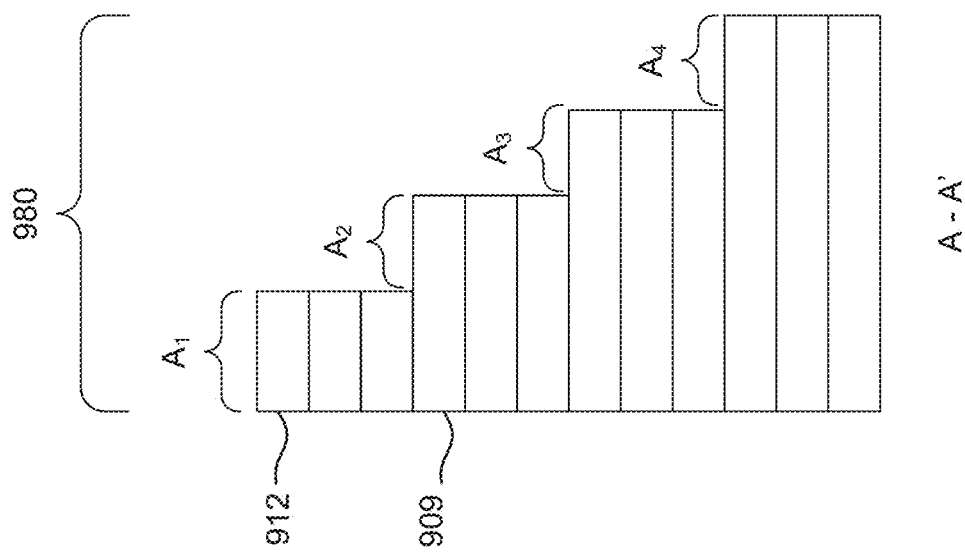
FIG. 9B illustrates a cross-sectional view of staircase regions, according to some embodiments.
Figure 9A:
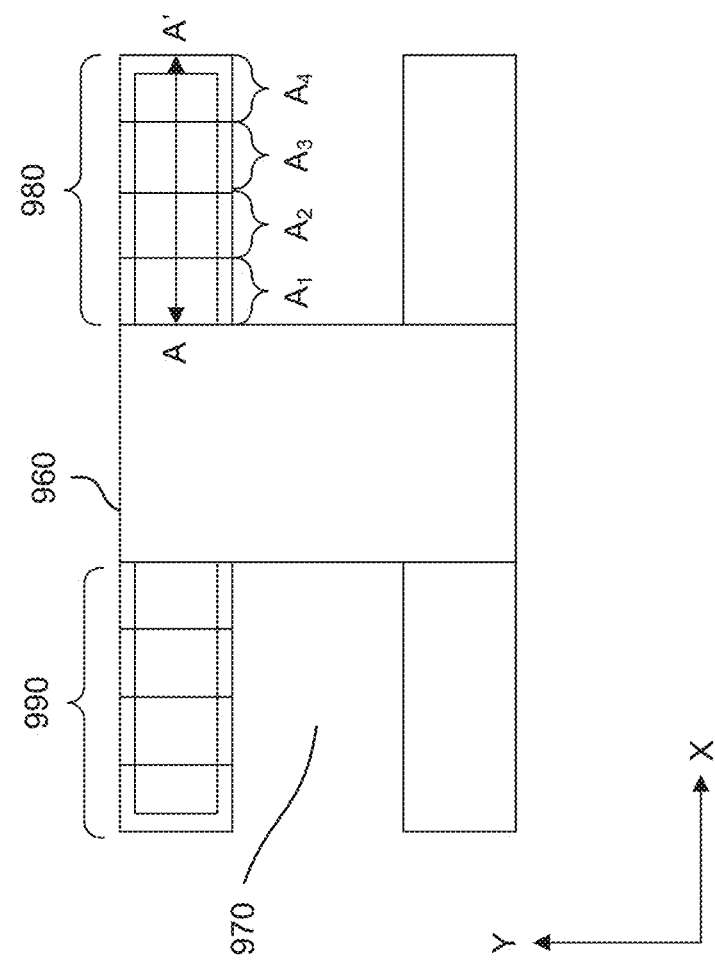
FIG. 9A illustrates a top view of an exemplary 3D memory structure after forming an interleaved staircase structure at each of the staircase regions, according to some embodiments.

FIG. 9A shows a top view of 3D memory device 900 after forming an interleaved staircase structure at each of a plurality of staircase regions 980 and 990. The interleaved staircase structure is formed by forming a second staircase structure on the first staircase structure at each of staircase regions 880 and 890 of 3D memory device 800 (e.g. superimpose the second staircase structure on the first staircase structure). The forming of second staircase structure includes applying a repetitive etch-trim process using a mask stack (not shown) formed and patterned over a top surface of 3D memory device 800. In some embodiments, the mask stack can include photoresist or carbon-based polymer material. The mask stack exposes an edge of each of the staircase regions 880 and 890 in a first direction (e.g., x-direction) and covers 3D memory device 800 extensively in a second direction (e.g., y-direction). In some embodiments, the first direction is perpendicular to the second direction and both the first and the second directions are parallel to a surface of the substrate. As the result, the etch-trim process only happens in the first direction (e.g., x-direction) in FIG. 9A. The etch-trim process is to remove M of the consecutive SC layers and therefore can include the repetitive etching processes or any other wet/dry etching processes. Therefore, the resulting interleaved staircase structure at each of staircase regions 980 and 990 includes a second number (N) steps in the first direction (e.g., x-direction) and M steps in the second direction (e.g., y-direction). Each of the N steps in the first direction has M levels and each of the M steps in the second direction has one level. The mask stack is then removed to expose a top surface of 3D memory device 900. In some embodiments, the interleaved staircase structure has four steps (N=4) in the first direction (e.g., x-direction) and three steps (M=3) in the second direction (e.g., y-direction) at each of staircase regions 980. In some embodiments, the interleaved staircase structure has two or more steps (N≥2) in the first direction (e.g., x-direction) at each of staircase regions 980 and 990. In some embodiments, the second staircase structure does not form at stack storage region 960.

FIG. 9B represents an embodiment, where the interleaved staircase structure has four (N=4) steps in the first direction (e.g., x-direction) and three steps (M=3) in the second direction (e.g., y-direction) at each of staircase regions 980. The cross-sectional view along line A-A', specified by FIG. 9A, exhibits staircase region 980 along the first direction (e.g., x-direction). Referring to FIG. 9B, four (N=4) steps are shown along the first direction (e.g., x-direction) and forms four (N=4) stair regions (indicated by $A_1$-$A_4$ in FIG. 9A), where each of the four (N=4) steps has three (M=3) levels. Since region $A_2$ is adjacent to region $A_1$, a first top-most SC layer (SC layer 912) at region $A_1$ is three (M=3) levels top to a second top-most SC layer (SC layer 909) at region $A_2$. In some embodiment, three steps are formed (M=3) in region $A_2$ in the second direction (e.g., y-direction), and each step is one level high and its top-most SC layer (e.g., SC layer 909) is three levels below (M=3) to the top-most SC layer (e.g., SC layer 912) of region $A_1$. In some embodiments, the interleaved staircase structure has a plurality of steps (e.g. N=any positive number) in the first direction (e.g., x-direction) at each of staircase regions 980, and each of the plurality of steps in the first direction has M levels. In some embodiments, stair region $A_3$ and $A_4$ have the same or similar structure as region $A_1$ and $A_2$. In some embodiments, cross-sectional views of staircase regions 990 are identical to those of staircase regions 980.

Figure 9C:
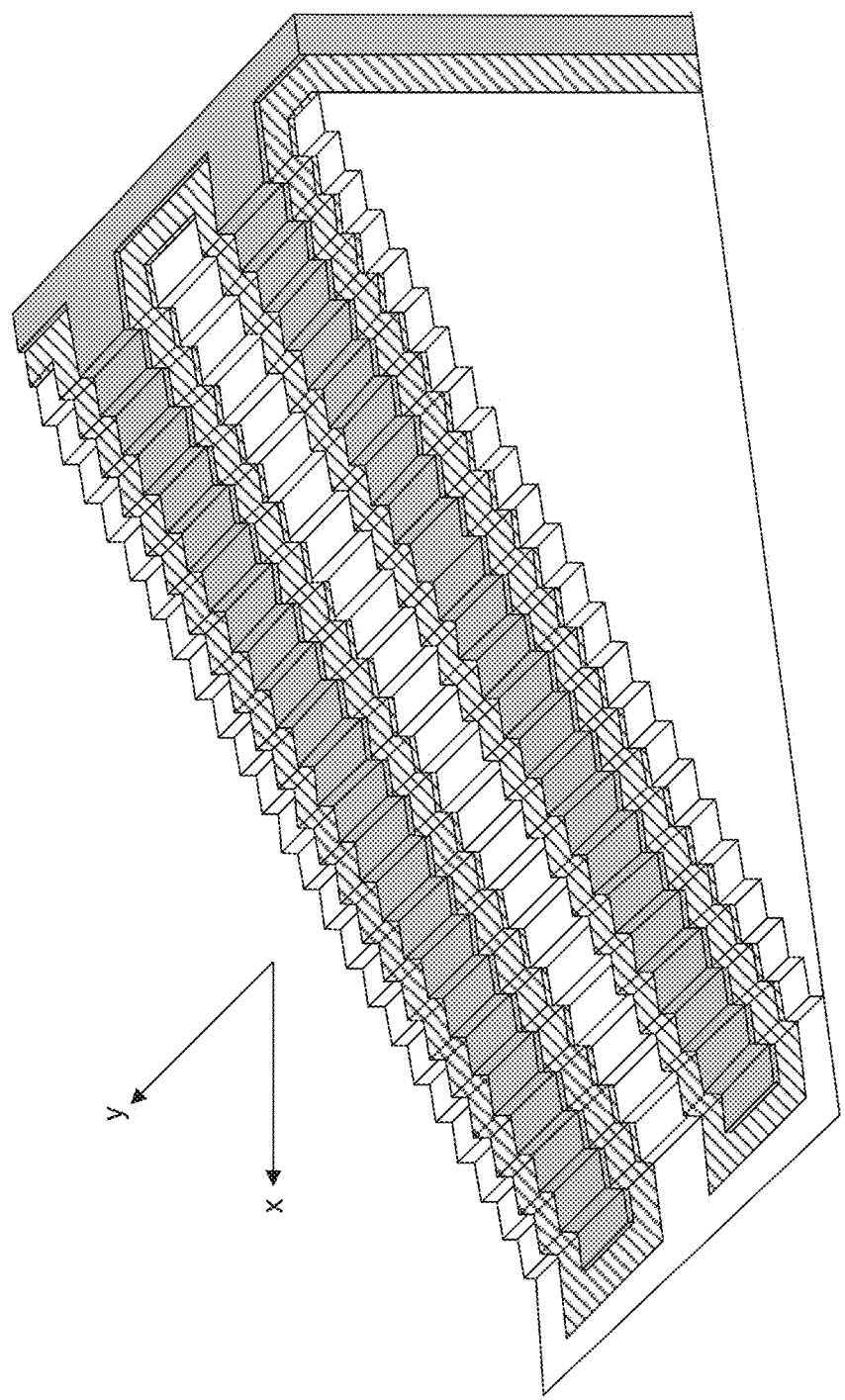
FIG. 9C illustrates a 3D-view of the staircase region of FIG. 9A.

FIG. 9C shows an exemplary 3D view of the interleaved staircase structure at each of staircase regions 980 and 990 of 3D memory device 900. The interleaved staircase structure includes N steps in the first direction (e.g., x-direction) and M steps in the second direction (e.g., y-direction). Each of the N steps in the first direction has M levels, while each of the M steps in the second direction has one level. In some embodiments, the interleaved staircase structure has twenty-four steps (N=24) in the first direction (e.g., x-direction) and three steps (M=3) in the second direction (e.g., y-direction), where each of the steps in the first direction has three (M=3) levels and each of the steps in the second direction has one level. In some embodiments, the interleaved staircase structure has the second number (N) of steps in the first direction (e.g., x-direction) and the first number (M) of steps in the second direction (e.g., y-direction), where each of the steps in the first direction has M levels and each of the steps in the second direction has one level.

Figure 10:
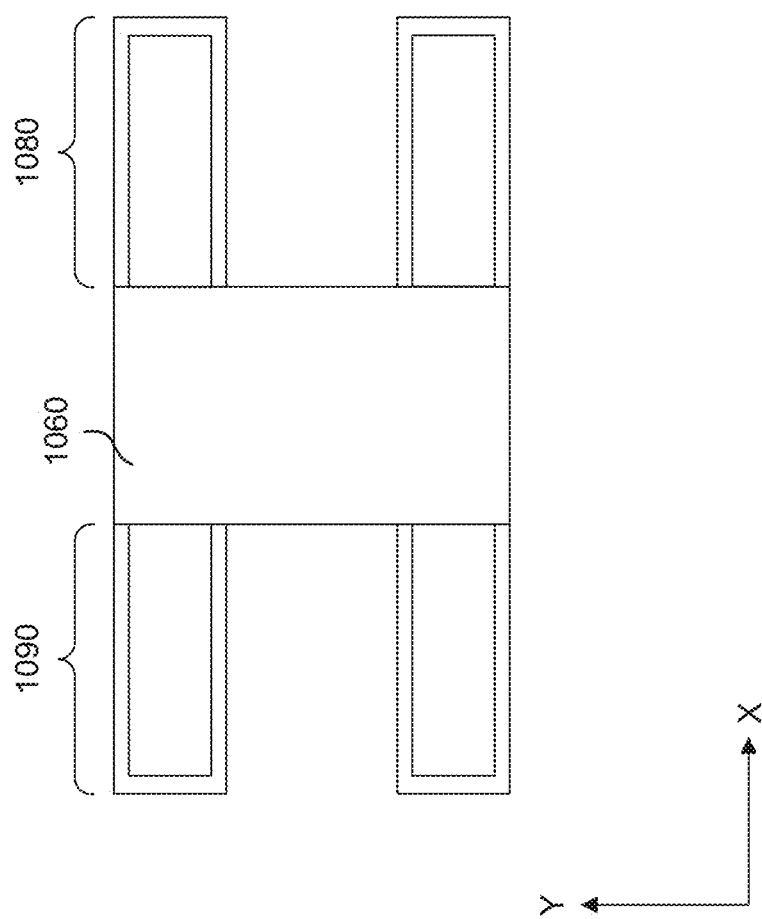
FIG. 10 illustrates a top view of an exemplary 3D memory structure, according to some embodiments.
Figure 11A:
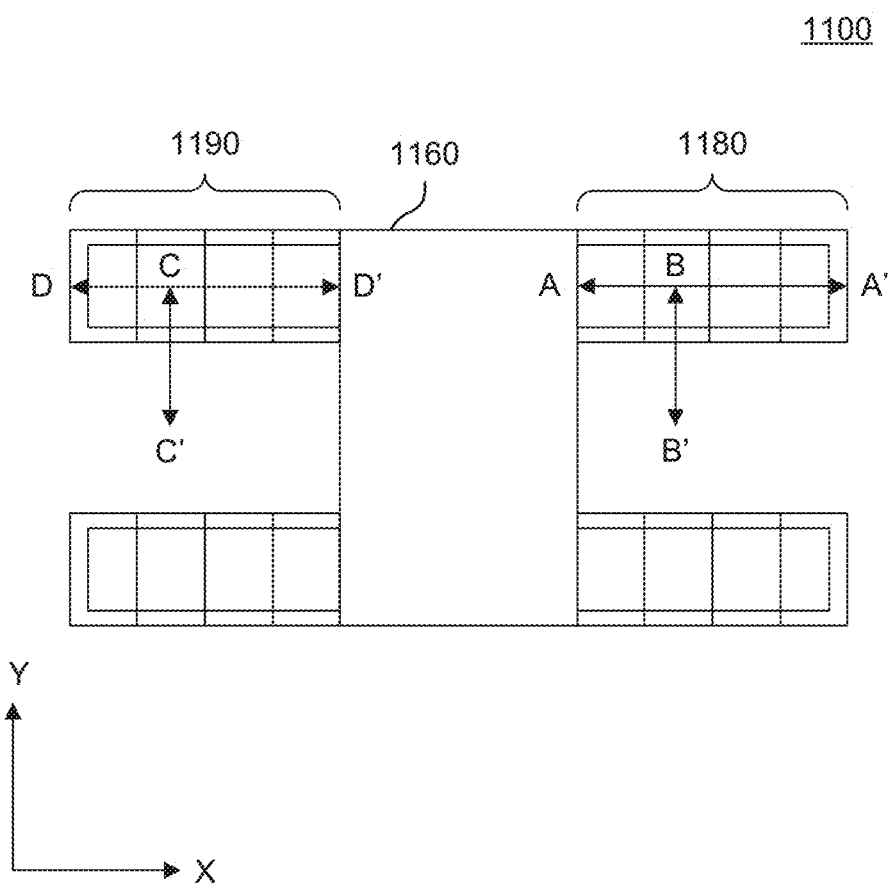
FIG. 11A illustrates a top view of an exemplary 3D memory structure after forming an interleaved and staggered staircase structure at each of the staircase regions, according to some embodiments.
Figure 11B:
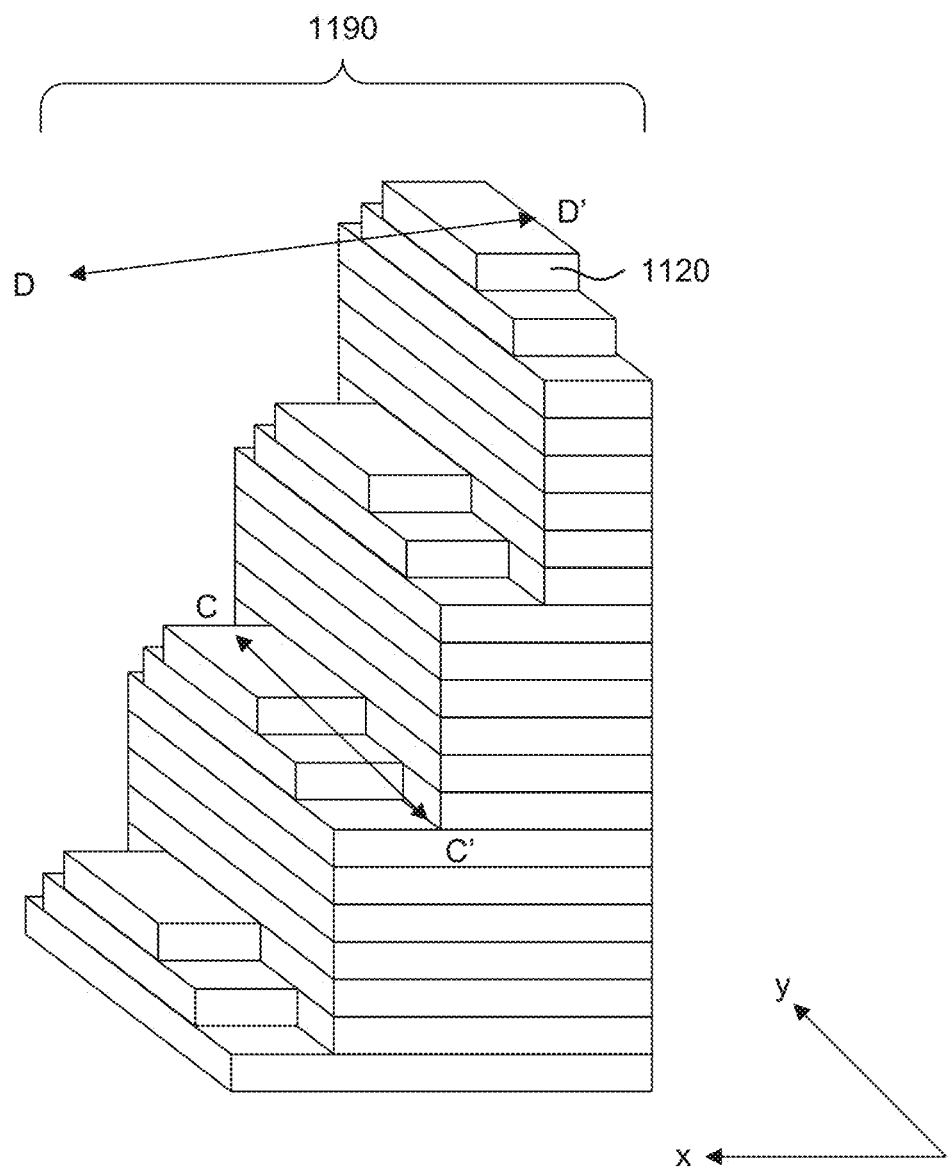
FIGS. 11B-11C illustrate 3D-views of the staircase region of FIG. 11A.
Figure 11C:
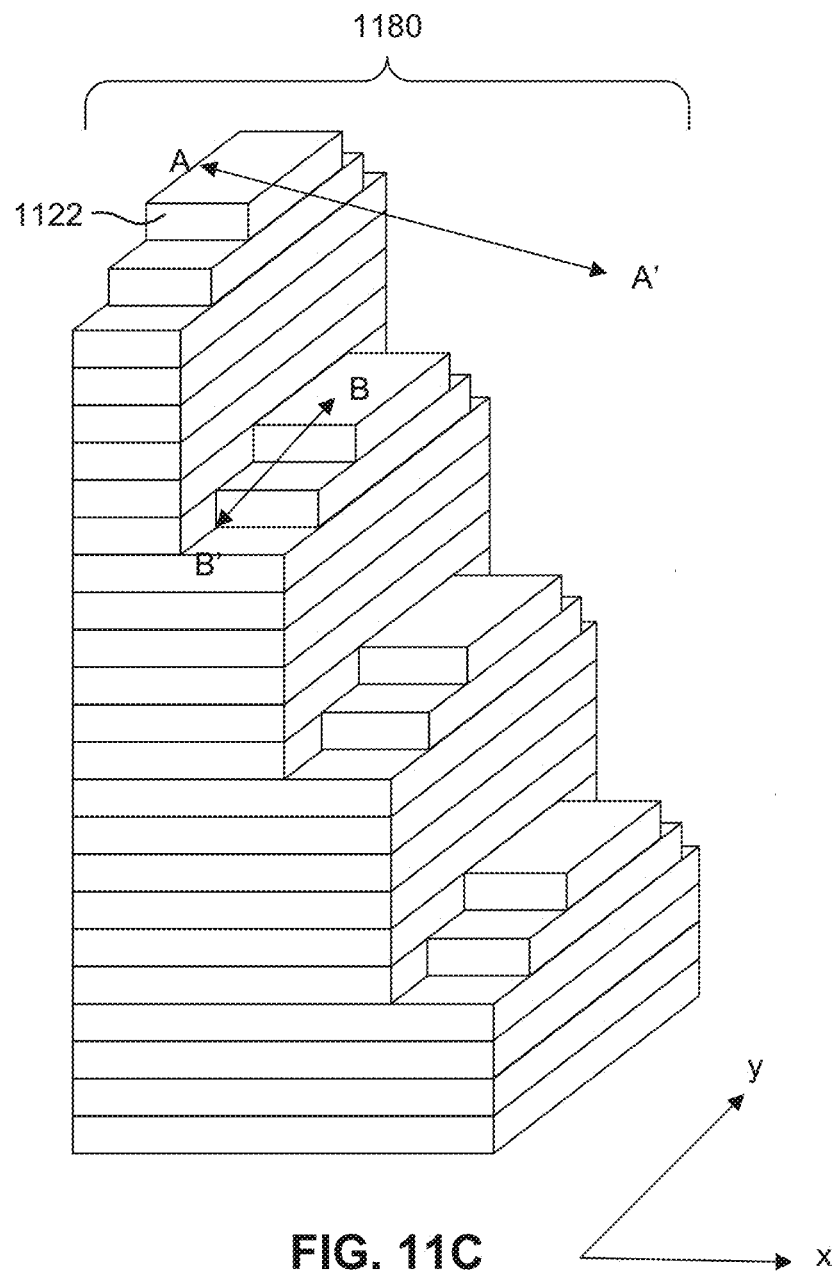

FIGS. 10-11C represent an embodiment of a staggered and interleaved staircase structure. Starting from 3D memory device 800, a mask stack (not shown) is used to expose a first plurality of staircase regions (e.g., staircase regions 890) and covers a second plurality of staircase regions (e.g., staircase regions 880). In some embodiments, the mask stack can include photoresist or carbon-based polymer material. In some embodiments, the mask stack covers stack storage region 860. An etching process is applied to remove M of consecutive SC layers at the exposed staircase regions. As the result, as shown in FIG. 10, a top-most SC layer at staircase regions 1090, exposed by the mask stack, are M levels lower than that at staircase regions 1080. The mask stack is then removed after the etching process. In some embodiments, the etching process can be the repetition of the etching process or any other dry/wet etching processes.

FIG. 11A shows a top view of 3D memory device 1100 with a staggered and interleaved staircase structure at each of a plurality of staircase regions 1180 and 1190. The staggered and interleaved staircase structure is formed by forming a third staircase structure at each of staircase regions 1080 and 1090. The forming of the third staircase structure includes applying a repetitive etch-trim process using a mask stack (not shown) formed and patterned over a top surface of the 3D memory device 1000. In some embodiments, the mask stack can include photoresist or carbon-based polymer material. The mask stack exposes an edge of each of staircase regions 1080 and 1090 in a first direction (e.g., x-direction) and covers 3D memory device 1000 extensively in a second direction (e.g., y-direction). As the result, the etch-trim process mostly happens in the first direction (e.g., x-direction) in FIG. 11A. The etch-trim process is to remove twice of M (2M) of the consecutive SC layers and therefore can include the repetitive etching process or any other wet/dry etching processes. Therefore, the resulting staggered and interleaved staircase structure at each of staircase regions 1180 and 1190 includes total a third number (Q) of steps in the first direction (e.g., x-direction), where each of the Q steps has (2M) levels. A top-most SC layer from staircase regions 1190 is M levels lower than that from staircase regions 1180. The mask stack is then removed to expose 3D memory device 1100. In some embodiments, the staggered and interleaved staircase structure has four steps (Q=4) in the first direction (e.g., x-direction) at each of staircase regions 1180 and 1190, and each of the four steps has (2M) levels. In some embodiments, the staggered and interleaved staircase structure has two or more steps (Q>2) in the first direction (e.g., x-direction) at each of staircase regions 1180 and 1190, and each of the Q steps has (2M) levels. In some embodiments, the staggered and interleaved structure has the third number (Q) of steps in the first direction (e.g., x-direction) and the first number (M) of steps in the second direction (e.g., y-direction) at each of staircase regions of a 3D memory device, where each of the Q steps in the first direction has 2M levels, each of the M steps in the second direction has one level, and a top-most SC layer at a first plurality of staircase regions is M levels lower than a top-most SC layer at a second plurality of staircase regions. In some embodiments, the numbers M, N and Q can be any positive number. In some embodiments, after an interconnect formation process, one of staircase regions 1180 and one of staircase regions 1190 provide a word line fan-out to uniquely select each of memory cells along a semiconductor channel in stacked storage structure region 1160.

FIG. 11B and FIG. 11C represent exemplary 3D views of the staggered and interleaved staircase structure at each of staircase regions 1180 and 1190, respectively, of 3D memory device 1100. Referring to FIGS. 11B and 11C, the staggered and interleaved staircase structure has four (Q=4) steps in the first direction (e.g., x-direction) and each of the Q steps has six steps (2×M=2×3=6) in the second direction (e.g., y-direction) at each of the staircase regions 1180 and 1190. A first top-most SC layer (e.g. layer 1120) from staircase region 1190 is three levels (M=3) below to a second top-most SC layer (e.g. layer 1122) from staircase region 1180. The lines A-A', B-B', C-C' and D-D' correspond to the ones in FIG. 11A. In some embodiments, each of staircase regions 1190 and 1180 exhibits a staggered and interleaved staircase structure, which includes Q steps in the first direction (e.g., x-direction) and M steps in the second direction (e.g., y-direction). Each of the Q steps in the first direction has (2M) levels, while each of the M steps in the second direction has one level. At least one of staircase regions 1190 is M levels lower than at least one of staircase regions 1180. In some embodiments, the staggered and interleaved staircase structure has five steps (Q=5) in the first direction (e.g., x-direction) and three steps (M=3) in the second direction (e.g., y-direction), where each of the Q steps in the first direction (e.g., x-direction) has six levels (2×M=2×3=6), each of the M steps in the second direction (e.g., y-direction) has one level and at least one of the staircase region 1190 is three (M=3) levels below to at least one of the staircase region 1180. In some embodiments, the staggered and interleaved staircase structure has four steps (Q=4) in the first direction (e.g., x-direction) and four steps (M=4) in the second direction (e.g., y-direction), where each of the Q steps in the first direction (e.g., x-direction) has eight levels (2×M=2×4=8), each of the M steps in the second direction (e.g., y-direction) has one level and staircase region 1190 is four (M=4) levels below to the staircase region 1180. In some embodiments, after an interconnect formation process, at least one of the staircase regions 1180 and at least one of the staircase regions 1190 provide a word line fan-out to uniquely select each of memory cells along a semiconductor channel in stacked storage structure region 1160.

Figure 12:
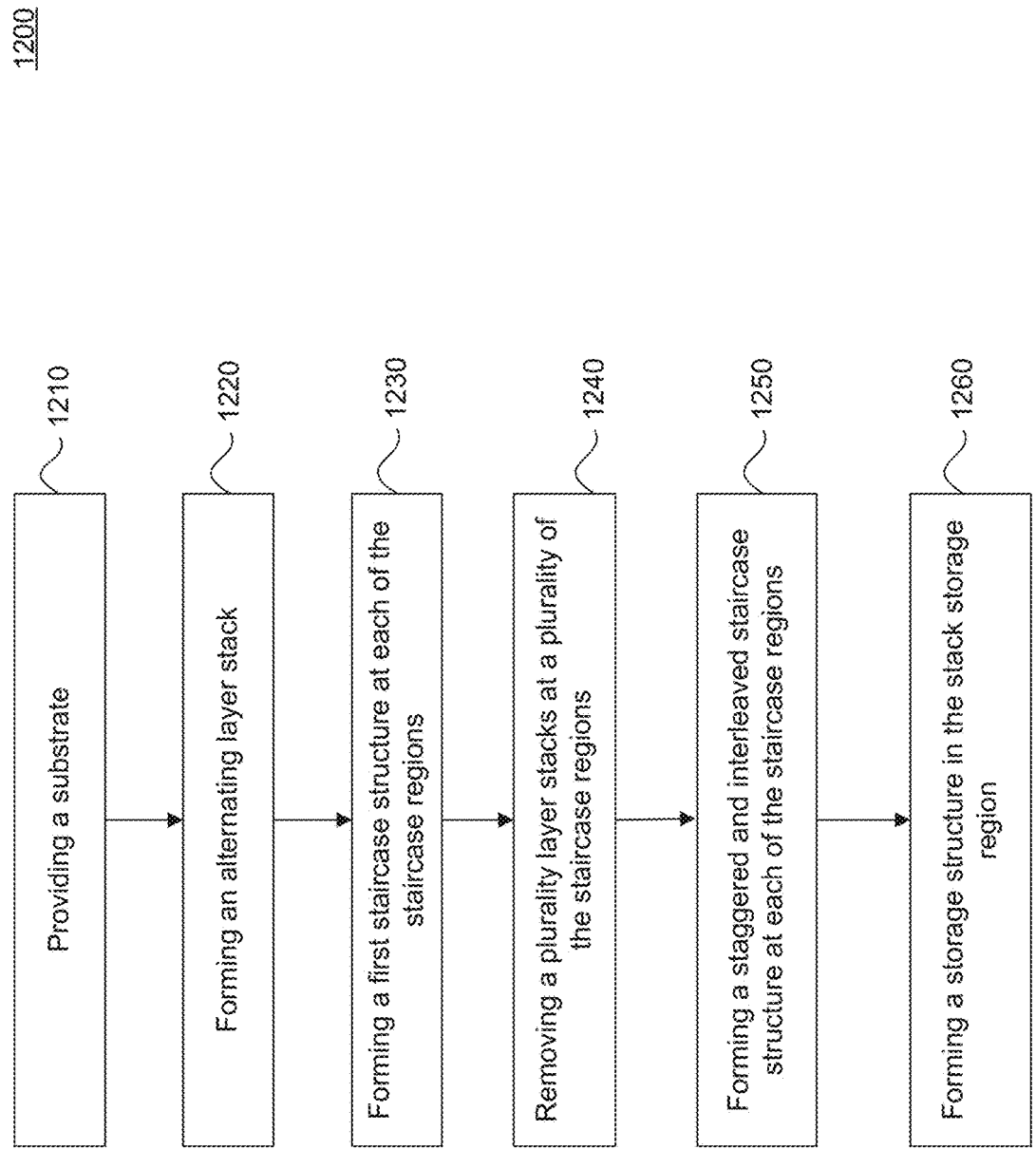
FIG. 12 is a flowchart of an exemplary method for forming a 3D memory device, according to some embodiments.

Embodiments of the present disclosure further provide a method for forming a staggered and interleaved staircase structure in a 3D memory device. FIG. 12 illustrates an exemplary method 1200 for forming a 3D memory device, according to some embodiments. The operations of method 1200) can be used to form memory device structures illustrated in FIGS. 1-11C. It should be understood that the operations shown in method 1200 are not exhaustive and that other operations can be performed as well before, after, or between any of the illustrated operations. In some embodiments, some operations of exemplary method 1200 can be omitted or include other operations that are not described here for simplicity. In some embodiments, operations of method 1200 can be performed in a different order and/or vary.

In operation 1210, a substrate is provided to from the 3D memory device. The substrate can include any suitable material for forming the three-dimensional memory structure. For example, the substrate can include silicon, silicon germanium, silicon carbide, SOI, GOI, glass, gallium nitride, gallium arsenide, plastic sheet and/or other suitable III-V compound.

In operation 1220, an alternating layer stack is deposited over the substrate. Each layer stack of the alternating layer stack represents a SC layer. A SC layer can include a dielectric layer pair with a first material layer and a second material layer. In some embodiments, the first material layer can be an insulating layer and the second material layer can be an sacrificial layer, and vice versa. In some embodiments, the first material layer can be the insulating layer and the second material layer can be a conductive material layer, and vice versa. The sacrificial layer can include materials such as silicon nitride, poly-crystalline silicon, poly-crystalline germanium, poly-crystalline germanium-silicon, any other suitable material, and/or combinations thereof. The insulating layer can include materials such as silicon oxide, aluminum oxide or other suitable materials. The conductive material layer can include materials such as tungsten, titanium nitride, tantalum nitride, tungsten nitride, any other suitable material, and/or combinations thereof. Each of the insulating, sacrificial, and conductive material layers can include materials deposited by one or more thin film deposition processes including, but not limiting to, CVD, PVD, ALD, or any combinations thereof. An example of the plurality of SC layers can be alternating layers 102 and 104 as described above in FIG. 1.

At operation 1230, a mask stack is used to pattern a stack storage region and a plurality of staircase regions on a top surface of the SC layers. Each of the staircase regions is adjacent to the stack storage region. In some embodiments, a first plurality of staircase regions are separated from a second plurality of staircase regions in a horizontal direction by the stack storage regions. In some embodiments, the stack storage region and the plurality of staircase regions are patterned by the mask stack using a plurality process including lithography. In some embodiments, the mask stack can include photoresist or carbon-based polymer material. An example of the stack storage region and the plurality of SC layers can be regions 760, 780 and 790 as described above in FIG. 7A. A first staircase structure is formed at each of the staircase regions. The first staircase structure can be formed at each of the staircase regions by repetitively performing an etch-trim process using the mask stack. The etch-trim process includes an etching process and a trimming process. In some embodiments, the etching process etches a portion of a SC layer. In some embodiments, the etching process etches a portion of a plurality of SC layers. In some embodiments, one or more etchants are used in the etching process, and each of the etchants etches the first material layer at much higher etch rate than the second material layer, or vice versa (e.g. high etching selectivity between the first material layer and the second material layer). In some embodiments, the etching process can precisely control the etching of SC layers because of high etching selectivity between the first and the second material layer. The trimming process includes a suitable etch (e.g., an isotropic dry etch or a wet etch) of the mask stack and happens at directions parallel to a surface of the substrate. The amount of trimmed mask stack can be directly relevant to the lateral dimensions of the first staircase structure. After the repetitive etch-trim process, the resulting first staircase structure includes a first number (M) of steps, where each of the M steps is one level. The etch-trim process can be referred to the descriptions of FIGS. 1-6. The formation of the first staircase structure can be referred to the descriptions of FIGS. 8A-8B.

At operation 1240, a mask stack is patterned to expose the first plurality of the staircase regions and cover the second plurality of the staircase regions. In some embodiments, the mask stack covers the stack storage region. In some embodiments, the mask stack is patterned by a lithography process. An etching process, similar to the etching process used in the etch-trim process, is applied to remove the first number (M) of SC layers from the exposed first staircase regions. The mask stack is removed after the etching process. As a result, a top-most SC layer at the first plurality of staircase regions is M levels lower than that at the second plurality of staircase regions. An example of operation 1250 can be referred to the description of FIG. 10.

At operation 1250, a mask stack is patterned to expose an edge of each of the staircase regions in a first direction (e.g., x-direction). In some embodiments, the mask stack extensively covers the 3D memory device in a second direction (e.g., y-direction). The staggered and interleaved staircase structure can be formed by a repetitive etch-trim process using the mask stack. The etch-trim process includes a trimming process and an etching process which etches twice of M (2M) of SC layers. Since the mask stack covers the 3D memory device extensively in the second direction, the entire repetitive etch-trim processes happen mostly at the first direction. The mask stack is then removed after finishing the repetitive etch-trim processes. The formation of the staggered and interleaved staircase structure can be referred to the descriptions of FIGS. 11A-11C.

The final staggered and interleaved staircase structure includes a plurality of steps in a first horizontal direction and M steps in a second horizontal direction. Each of the plurality steps in the first horizontal direction is 2M levels high, each of the M steps in the second horizontal direction is one level high. A top-most SC layer at the first plurality of staircase regions is M levels lower than that at the second plurality of staircase regions. The first horizontal direction is perpendicular to the second horizontal direction, and both the first and the second horizontal direction are parallel to a surface of the substrate. The first plurality of staircase regions is separated from the second plurality of staircase regions by the stack storage region. As the result, the staggered and interleaved staircase structure from one of the first plurality of staircase regions and one of the second plurality of staircase regions can expose a portion of top surfaces of each SC layers.

At operation 1260, a storage structure, including semiconductor channels, is formed in the stack storage region. Further process steps can include forming an interconnect structure at each of the staircase regions of the 3D memory device. In some embodiments, the semiconductor channels are formed and extended through the SC layers at the stack storage region. Word lines of the 3D memory device are formed by replacing a sacrificial material layer of each SC layers with a conductor layer. The staggered and interleaved staircase structure at one of the first plurality of staircase regions and one of the second plurality of staircase regions exposes a portion of each word lines at the 3D memory device, which allows the interconnect structure (e.g. a VIA structure) to provide a fan-out for each word lines to control each of the semiconductor channels.

The present disclosure describes various embodiments of 3D memory devices and methods of making the same. In some embodiments, the 3D memory devices include an alternating layer stack disposed on a substrate, a storage structure including a plurality of vertical semiconductor channels, a first plurality of staircase regions adjacent to the storage structure, and a second plurality of staircase regions adjacent to the storage structure where the first and the second plurality of staircase regions are horizontally separated by the storage structure. Each of the first and the second staircase regions further includes a staircase structure with a first number (M) of one-level steps in a first direction and a plurality of M-levels steps in a second direction. A top-most layer stack of the staircase structure in the second staircase regions is M-levels lower than that in the first staircase regions.

In some embodiments, A method for forming a 3D memory device includes forming an alternating layer stack comprising a plurality of dielectric layer pairs disposed over a substrate, forming staircase regions where each of the staircase regions has a staircase structure with a first number (M) of steps in a first direction, where each of the M steps exposes a portion of a surface of a layer stack of the alternating layer stack and the first number M is a positive number. The method further includes removing M layer stacks of the alternating layer stack at a first plurality of the staircase regions, removing 2M of a portion of layer stacks of the alternating layer stack at each of the staircase regions using a first mask stack, trimming the first mask stack, and repeating, sequentially, the removing 2M of a portion of layer stacks of the alternating layer stack at each of the staircase regions using the first mask stack and the trimming the first mask stack. The forming the staircase regions further includes forming a second mask stack over the alternating layer stack, patterning the second mask stack to define the staircase regions over the alternating layer stack using a lithography process, removing a portion of top-most dielectric layer pair using the second mask stack, trimming the second mask stack, and repeating, sequentially, the removing and the trimming until the M steps are formed. The removing M layer stacks of the alternating layer stack includes dry etching, wet etching, or a combination thereof. The trimming the first mask stack includes etching the first mask stack incrementally and inwardly using an isotropic dry etch, a wet etch, or a combination thereof. The first mask stack is patterned by a lithography process to expose at least an edge of each of the staircase regions in a first direction and covers each of the staircase regions extensively in a second direction, where the first direction is perpendicular to the second direction, and both the first and second directions are parallel to a top surface of the substrate. The method further includes forming a plurality of vertical semiconductor channels in a stack storage region on the substrate, where each of the staircase regions is adjacent to the stack storage region. A lithography process is to define the first plurality of staircase regions and other staircase regions where the first plurality of staircase regions and the other staircase regions are separated by the stack storage region.

In some embodiments, a method for forming a 3D memory device includes forming an alternating layer stack over a substrate, removing a first number (M) of layer stacks of the alternating layer stack over a first portion of a surface of the alternating layer stack, where M is greater than one, and forming staircase structures over a second portion of the surface of the alternating layer stack, where the second portion of the surface includes the first portion of the surface and each of the staircase structures has M steps in a first direction, where each of the M steps is one level, exposing a portion of a surface of a layer stack of the alternating layer stack. The method further includes repeating, sequentially, a removing 2M number of layer stacks of the alternating layer stack at each of the staircase structures using a first mask stack and a trimming the first mask stack. The forming the alternating layer stack includes depositing the layers using chemical vapor deposition, physical vapor deposition, plasma-enhanced CVD, sputtering, metal-organic chemical vapor deposition, atomic layer deposition, or a combination thereof. The forming the alternating layer stack on the substrate includes disposing a plurality of dielectric layer pair on the substrate.

In some embodiments, a 3D memory device includes an alternating layer stack disposed over a substrate, a storage structure includes a plurality of vertical semiconductor channels, a first staircase regions adjacent to the storage structure, and a second staircase regions adjacent to the storage structure, where the second staircase regions are horizontally separated from the first staircase regions by the storage structure. The 3D memory device further includes a staircase structure disposed at each of the first and the second staircase regions to expose a portion of a plurality of layer stacks of the alternating layer stack, where the staircase structure includes a plurality of steps in a first direction and a first number (M) of steps in a second direction, where each of the steps in the first direction has 2M levels. The first direction is perpendicular to the second direction, and both the first and the second directions are parallel to a top surface of the substrate. Each of steps in the second direction of the staircase structure is one level. A top-most layer stack of a staircase structure in the second staircase region is M levels lower than that in the first staircase region. Each layer stack of the alternating layer stack includes an insulating material layer and a sacrificial material layer, or the insulating material layer and a conductive material layer. The insulating material layer includes silicon oxide or aluminum oxide. The sacrificial material includes poly-crystalline silicon, silicon nitride, poly-crystalline germanium, poly-crystalline germanium-silicon, or a combination thereof. The conductive material layer includes poly-crystalline silicon, silicide, nickel, titanium, platinum, aluminum, titanium nitride, tantalum nitride, tungsten nitride, or a combination thereof.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A 3D memory device, comprising:
   a plurality of alternating layer stacks disposed over a substrate;
   a storage structure comprises a plurality of vertical semiconductor channels formed over the substrate;
   a first staircase region adjacent to the storage structure;
   a second staircase region adjacent to the storage structure, wherein the second staircase region is horizontally, along a first direction, separated from the first staircase region by the storage structure; and
   a staircase structure disposed at each of the first staircase region and the second staircase region to expose a portion of each alternating layer stack of the plurality of alternating layer stacks, wherein the staircase structure comprises a first plurality of steps in the first direction, a second plurality of steps in a second direction perpendicular to the first direction, and a third plurality of steps in a third direction perpendicular to the first direction and opposite to the second direction, wherein:
      a total number of steps of the second plurality of steps is M, wherein M is a natural number greater than or equal to 2;
      each step of the second plurality of steps individually along with a step of the third plurality of steps expose a common alternating layer stack of the plurality of alternating layer stacks;
      each step of the first plurality of steps has 2M levels, wherein each level represents a height of an alternating layer stack of the plurality of layer stack; and
      a top-most layer stack of the staircase structure in the second staircase region is M levels lower than another top-most layer stack of the staircase structure in the first staircase region.

2. The 3D memory device of claim 1, wherein each step of the second plurality of steps is one level.

3. The 3D memory device of claim 1, wherein each layer stack of the alternating layer stack comprises an insulating material layer and a sacrificial material layer.

4. The 3D memory device of claim 3, wherein the insulating material layer comprises silicon oxide or aluminum oxide, the sacrificial material comprises poly-crystalline silicon, silicon nitride, poly-crystalline germanium, poly-crystalline germanium-silicon, or a combination thereof.

5. The 3D memory device of claim 1, wherein each layer stack of the alternating layer stack comprises an insulating material layer and a conductive material layer.

6. The 3D memory device of claim 5, wherein the conductive material layer comprises poly-crystalline silicon, silicide, nickel, titanium, platinum, aluminum, titanium nitride, tantalum nitride, tungsten nitride, or a combination thereof.

7. A 3D memory device, comprising:
   a plurality of alternating layer stacks disposed over a substrate;
   a storage structure comprises a plurality of vertical semiconductor channels formed over the substrate;
   a first staircase region adjacent to the storage structure;
   a second staircase region adjacent to the storage structure, wherein the second staircase region is horizontally, along a first direction, separated from the first staircase region by the storage structure;
   a staircase structure disposed at each of the first staircase region and the second staircase region to expose a portion of each alternating layer stack of the plurality of alternating layer stacks, wherein the staircase structure comprises a first plurality of steps in the first direction, a second plurality of steps in a second direction perpendicular to the first direction, and a third plurality of steps in a third direction perpendicular to the first direction and opposite to the second direction, wherein:
      a total number of steps of the second plurality of steps is M, wherein M is a natural number greater than or equal to 2;
      each step of the second plurality of steps individually along with a step of the third plurality of steps expose a common alternating layer stack of the plurality of alternating layer stacks; and
      each step of the first plurality of steps has 2M levels, wherein each level represents a height of an alternating layer stack of the plurality of layer stack;
   a slit;
   a third staircase region adjacent to the first staircase region along the second direction; and
   a further staircase structure disposed at the third staircase region to expose another portion of the plurality of alternating layer stacks, wherein the further staircase structure is separated from the staircase structure by the slit.

8. The 3D memory device of claim 7, wherein a top-most step of the second plurality of steps comprises a same layer as another top-most step of the third plurality of steps.

* * * * *